United States Patent [19]
Ramde et al.

[11] Patent Number: 5,137,838
[45] Date of Patent: Aug. 11, 1992

[54] METHOD OF FABRICATING P-BURIED LAYERS FOR PNP DEVICES

[75] Inventors: Amolak Ramde; Sheldon Aronowitz, both of San Jose, Calif.

[73] Assignee: National Semiconductor Corporation, Santa Clara, Calif.

[21] Appl. No.: 710,646

[22] Filed: Jun. 5, 1991

[51] Int. Cl.$^5$ .................. H01L 21/265; H01L 21/74
[52] U.S. Cl. ........................ 437/24; 437/26; 437/30; 437/150; 437/959; 148/DIG. 58
[58] Field of Search ............ 327/24, 26, 27, 30, 327/31, 150, 933, 959; 148/DIG. 58, DIG. 26

[56] References Cited

U.S. PATENT DOCUMENTS

| | | | |
|---|---|---|---|
| 4,603,471 | 8/1986 | Strain | 437/24 |
| 4,728,619 | 3/1988 | Pfiester et al. | 437/44 |
| 4,746,964 | 5/1988 | Aronowitz | 357/63 |
| 4,835,112 | 5/1989 | Pfiester et al. | 437/27 |
| 4,940,671 | 7/1990 | Small et al. | 437/26 |

FOREIGN PATENT DOCUMENTS

| | | | |
|---|---|---|---|
| 0017243 | 1/1984 | Japan | 437/933 |
| 0137414 | 6/1988 | Japan | 437/933 |

OTHER PUBLICATIONS

Fair, R. B., "Quantitative theory of retarded base diffusion in silicon n–p–n structures with arsenic emitters", J. Appl. Phys., vol. 44, No. 1, pp. 283–291, Jan. 1973.

Primary Examiner—Brian E. Hearn
Assistant Examiner—C. Chaudhari
Attorney, Agent, or Firm—Gail W. Woodward; Irving S. Rappaport; James W. Rose

[57] ABSTRACT

A P-type buried layer is described for use with planar, silicon, monolithic, epitaxial, PN junction-isolated transistors of PNP conductivity primarily for use in IC construction. The buried layer includes a high concentration of boron and gallium along with germanium, which is in sufficient concentration to inhibit impurity diffusion in the silicon epitaxial layer. This inhibition effect has been found to be sufficient to cause the combination of boron and gallium to act as slow diffusers. The result is that the performance of arsenic and antimony, in the creation of buried layers for NPN transistors. Thus, the performance of NPN transistors can be matched for PNP transistors. This means that an IC can be fabricated so that more nearly equal performance NPN and PNP transistors can be fabricated simultaneously in a common substrate.

7 Claims, 2 Drawing Sheets

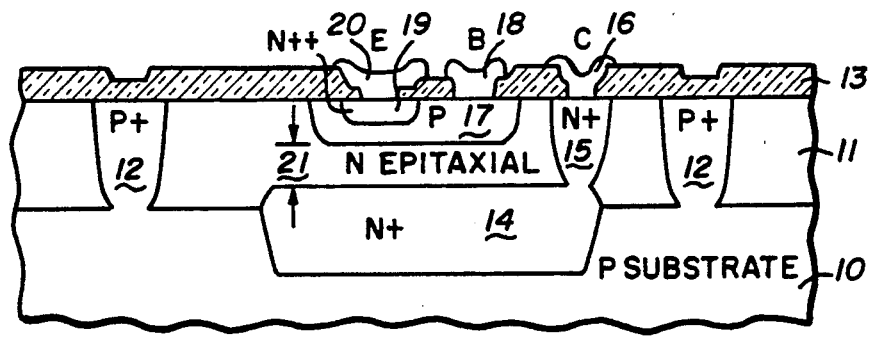
Fig_1 (PRIOR ART)
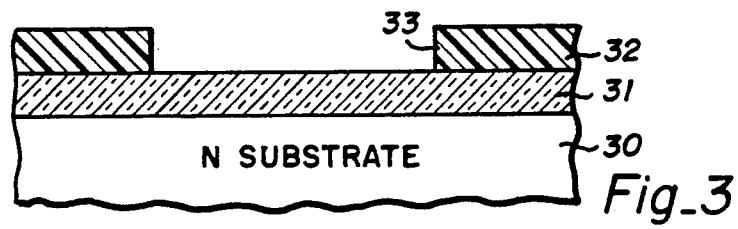
Fig_3
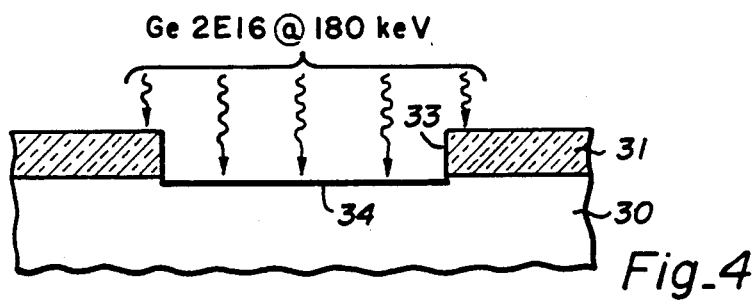
Fig_4
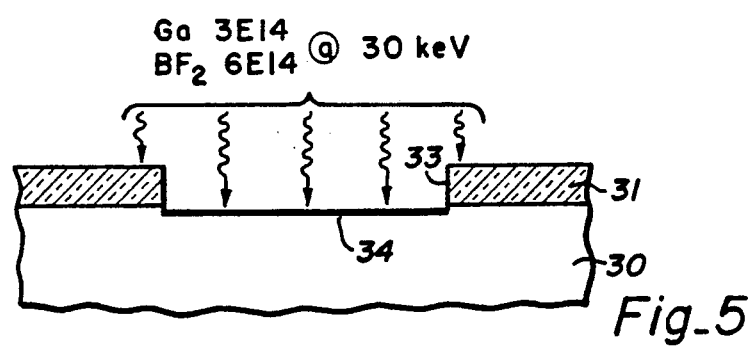
Fig_5
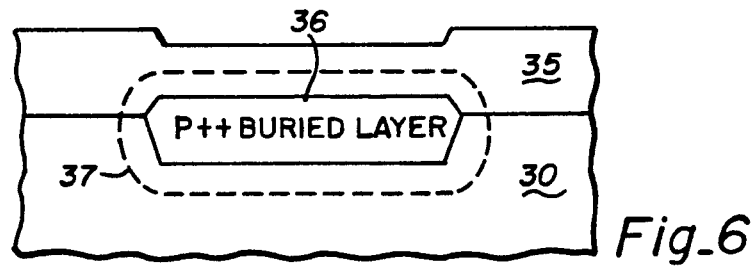
Fig_6

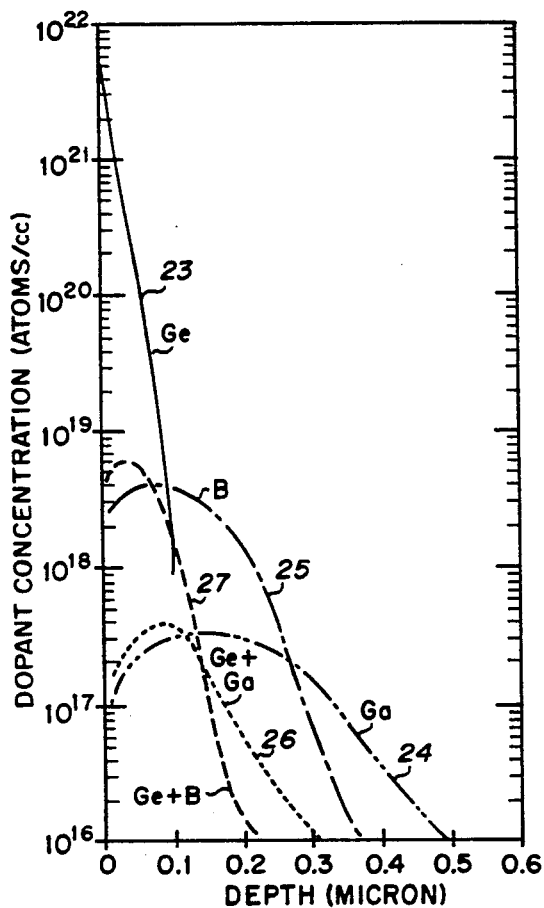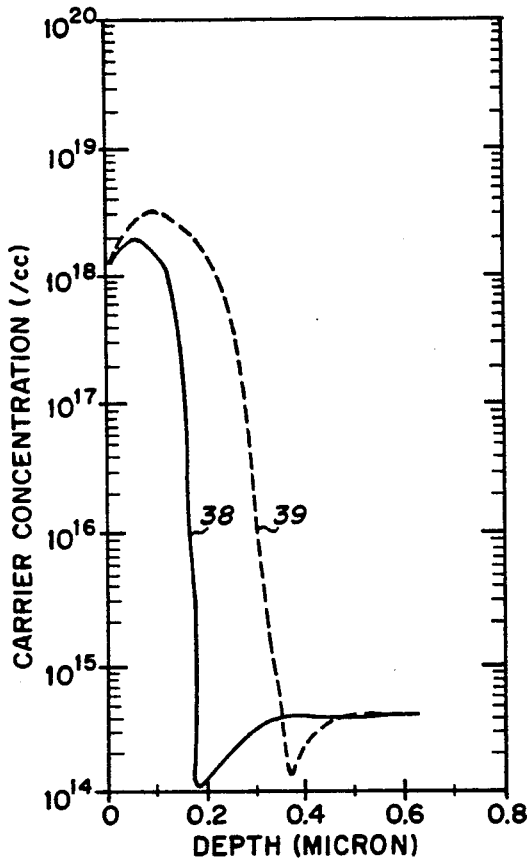
Fig_2
Fig_7

METHOD OF FABRICATING P-BURIED LAYERS FOR PNP DEVICES

BACKGROUND OF THE INVENTION

The invention relates to a fabrication process for creating highly conductive P-buried layers in planar, silicon, epitaxial, monolithic, PN junction isolated integrated circuit (IC) devices. Such buried layers are desirably located under active circuit elements, such as PNP transistors, to reduce parasitic resistance. N-buried layers have been used for many years and their fabrication has become routine in connection with planar NPN transistors and other related elements. These employ either arsenic or antimony as donor doping elements which are useful because both are relatively slow diffusers in silicon when compared with phosphorous, the normal N dopant of choice. However, no P acceptor dopants have an equally slow diffusion as compared with boron which has a diffusion that roughly matches that of phosphorous. Accordingly, most PNP transistors incorporate a boron doped buried layer. Unfortunately, the relatively rapid diffusion of boron results in a relatively thick buried layer. This characteristic means that to produce suitably high voltage PNP transistors the epitaxial layer must be made substantially thicker than the equivalent layer for an NPN transistor. Furthermore, in IC devices wherein vertical NPN and PNP transistors are fabricated in the same process, as is set forth in U.S. Pat. Nos. 4,940,671 and 4,908,328, the epitaxial layer thickness must be a compromise. This makes it difficult to simultaneously optimize the performance of PNP and NPN transistors.

It would be very useful to employ a P-dopant that will produce the desired low resistivity layer and yet will not diffuse excessively into an overlying epitaxial layer.

SUMMARY OF THE INVENTION

It is an object of the invention to create a P-buried layer suitable for use with vertically arrayed planar PNP transistors.

It is a further object of the invention to apply a p-type dopant to a silicon IC wafer in those regions where P-buried layers are desired along with a relatively heavy dose of germanium which acts to suppress the diffusion of the dopant.

These and other objects are achieved as follows. The silicon wafer in which a P-buried layer is to be created, is coated with a suitable oxide layer which is photolithographically removed where the buried layer is desired. Then, a relatively heavy dose of germanium is ion implanted, at a relatively high voltage, using the oxide as a mask. This implant is then annealed so that the implanted germanium atoms join the silicon crystal lattice in substitutional sites. Then, boron and gallium are ion implanted using the same oxide mask to localize them to the germanium-rich region. The wafer is then stripped of oxide and a conventional epitaxial layer applied by high temperature deposition. Then, a suitable oxide is formed over the epitaxial layer and a conventional isolation diffusion performed. During the epitaxial layer deposition and the isolation diffusion the buried layer dopant will out diffuse into the epitaxial layer which must be made thick enough to cope with the outdiffusion. Where boron plus gallium is employed the outdiffusion will be significant and the epitaxial layer must be made relatively thick. However, the inclusion of germanium in the buried layer region sufficiently retards the outdiffusion to where it is comparable to that of arsenic or antimony of the N-buried layer formation for NPN transistors.

BRIEF DESCRIPTION OF THE DRAWING

FIG. 1 is a cross section of that portion of a silicon wafer that includes an NPN transistor in accordance with the prior art.

FIG. 2 is a graph showing the post-anneal profiles of ion implanted boron and gallium dopant concentration alone and for boron and gallium in the presence of germanium.

FIGS. 3 through 6 represent cross sections of a portion of a silicon wafer showing the steps of creating a P-buried layer.

FIG. 7 is a graph showing carrier concentration following the step of FIG. 6 where the solid line represents the P-buried layer with germanium and the dashed line is the layer without germanium.

DESCRIPTION OF THE PRIOR ART

FIG. 1 illustrates a fragmental cross section of a silicon wafer containing a vertically arrayed NPN transistor. The wafer 10 is of P type conductivity and has deposited thereon an N-type epitaxial layer 11 which has a resistivity selected to provide the desired transistor collector characteristics. A heavily doped P++ isolation ring 12 is diffused completely through epitaxial layer 11 so as to isolate a tub of N type epitaxial material which will contain the active NPN transistor. Thus, the transistor will be PN junction isolated in a monolithic silicon IC. A planar surface oxide 13 covers the epitaxial layer 11 and is photolithographically contoured to assist in the creation of the well known planar transistor.

The transistor includes a conductive buried layer 14 which is heavily doped N++ and extends into the substrate wafer 10. Since outdiffusion will occur after the epitaxial layer is grown, the buried layer will also extend slightly into the epitaxial layer 11. A heavily diffused N++ sinker 15 provides a connection from buried layer 14 to a top surface metal contact 16 in the conventional planar transistor form of construction.

A P type base region 17 extends from the epitaxial layer 11 surface into the body and is provided with a metal surface contact 18. Base region 17, which is more heavily doped than the epitaxial material, has a resistivity selected to provide the desired transistor base parameters.

Emitter region 19, which is very heavily doped N++, is confined within base region 17 and extends part way therethrough. Surface metal contact 20 provides the NPN transistor emitter connection. It can be seen that the transistor electrodes are vertically arrayed and arrow 21 indicates the transistor collector region thickness. This dimension, along with the epitaxial layer resistivity, will largely determine the transistor collector breakdown voltage. For high collector voltage devices dimension 21 will be substantial and the epitaxial layer thickness will be primarily determined thereby. As a practical matter, buried layer 14 will be doped by either arsenic or antimony both of which diffuse relatively slowly as compared with phosphorous. Clearly, layer 14, which is deposited on the substrate wafer 10 prior to epitaxial layer 11, usually by chemical vapor deposition, will diffuse upwardly into the epitaxial layer. Since base region 17 diffuses downwardly it can be seen that dimension 21 will be determined by the layer thickness less the diffusion lengths. These diffusion lengths will develop mainly during the epitaxial layer growth and the subsequent isolation diffusion. By using slow diffusers in buried layer 14 dimension 21 will be maximized for a given epitaxial layer thickness.

It is to be understood that the above-described structure is typical of planar IC construction, but can be modified in many ways. One commonly used modification involves what is known as "hourglass" isolation. In this approach isolation region 12 has an hourglass shape due to the use of a two-step isolation process. Here the isolation impurities are first applied to the substrate wafer when the buried layer is deposited. Then, after epitaxial layer growth an aligned isolation impurity region is applied to the wafer top surface. The following diffusion cycle only has to diffuse the isolation region impurities half way through epitaxial layer. This means a reduced diffusion cycle time which also reduces the upward diffusion of buried layer 14. If the hourglass isolation diffusion is employed sinker 15 will also employ an hourglass shape. This is done by applying a high dose of impurities into the edge of the buried layer and an equivalent aligned deposit is applied on top of the epitaxial layer. Then, during the isolation diffusion, sinker 15 will also be created. This latter hourglass isolation process is mainly employed to reduce the epitaxial layer thickness, but it also has a secondary benefit. Since layer 11 is thinner and the isolation diffusion does not have to be driven completely through if the lateral diffusion is also greatly reduced. This reduces the area required for isolation and improves active device density.

DESCRIPTION OF THE INVENTION

The above prior art description shows how vertical planar NPN transistors can be created in IC form. When it comes to fabricating PNP transistors a different set of device limits come into play. The group three elements, which provide acceptor or P-type silicon doping, do not include slow diffusers equivalent to the group five donor elements arsenic and antimony. Typically, boron doping is employed, but its diffusion constant is relatively close to that of phosphorous which is a relatively fast diffuser. This means that when boron is used as a buried layer the outdiffusion is large and the epitaxial layer must be made proportionately thicker.

As shown in U.S. Pat. No. 4,746,964, gallium can be paired with boron to provide a reduced rate of diffusion and buried layers composed of a combination of boron and gallium are feasible. However, the improvement is not as great as desired.

We have discovered that if the silicon is doped with germanium, along with boron and gallium, the diffusion is inhibited to an extent where the acceptor diffusion proceeds at a relatively slow rate. The diffusion retardation becomes evident when about $5-7 \times 10^{15}$ atoms per $cm^2$ of germanium are deposited onto the silicon surface. The effect increases with increasing germanium content. FIG. 2 is a graph plotting the impurity profiles of germanium, boron and gallium in silicon. This graph was constructed from data taken when a P-type silicon wafer was treated as follows.

The wafer was ion implanted with germanium at a dose of $1.5 \times 10^{16}$ atoms/$cm^2$ at an energy of 50 keV. Gallium was implanted at a dose of $3 \times 10^{14}$ atoms/$cm^2$ at an energy of 30 keV and boron difluoride was implanted at a dose of $6 \times 10^{14}$ atoms/$cm^2$ at 30 keV. The germanium implant was followed by a 10 second anneal at 1100° C. and then a 30 minute anneal at 900° C. in pure oxygen. The gallium and boron implants were followed by a 30 minute anneal at 900° C. in pure oxygen. The gallium and boron were implanted in areas which had been germanium doped and in other areas which were free of germanium. Secondary Ion Magnetic Spectroscopy was employed to generate chemical profiles of the germanium, gallium and boron. Curve 23 shows the germanium profile. Curves 24 and 25 respectively show gallium and boron profiles without germanium. Curves 26 and 27 respectively show the gallium and boron profiles where the germanium was present. It can be seen that the acceptor penetration was approximately halved by the presence of germanium.

FIGS. 3 through 6 show the evolution of a silicon wafer in the formation of a P-buried layer in accordance with the invention. The drawing shows a fragment of a wafer and is not to scale. The vertical dimension has been exaggerated for clarity.

As shown in FIG. 3, an N-type substrate wafer 30 is provided with a one-micron thick oxide layer 31. A photoresist layer 32 is applied to the wafer and an opening 33 created to expose the oxide where a buried layer is to be created. The wafer is then etched to remove the oxide and expose the silicon surface inside opening 33.

The photoresist is then removed and the wafer oxidized in wet oxygen to develop a silicon notch, as shown, in the buried layer region. The wet oxide is then stripped off and the wafer implanted with germanium, as shown in FIG. 4. Germanium is implanted at a dose of $2 \times 10^{16}$ atoms/$cm^2$ at an energy of 180 keV. Thus, the silicon in region 34 becomes heavily germanium doped. The wafer is then annealed at 1100° C. in an inert or neutral ambient for 30 minutes. During this anneal the germanium atoms enter into the silicon crystal lattice at replacement sites. This anneal acts to relieve any crystal damage that may have developed during the implant.

Then, as shown in FIG. 5, the wafer is implanted with gallium at a dose of $3 \times 10^{14}$ atoms/$cm^2$ at 30 keV followed by boron difluoride at a dose of $6 \times 10^{14}$ atoms/$cm^2$ at 30 keV. The implant energies cause the projected range of either species to coincide, approximately. (This gives an approximate dose ratio of 2:3. The wafer is then annealed for 30 minutes at 900° C. in pure oxygen.

Following the final anneal, the wafer surface is stripped of oxide and carefully cleaned. Then, a 10-micron thick N type epitaxial layer is grown to create layer 35 of FIG. 6. It will be noted that the impurities implanted in FIGS. 4 and 5 combine to produce buried layer 36. The notch created in FIG. 4 serves to define the buried layer at the newly created wafer surface.

While not shown in FIGS. 3-6, other regions of the wafer can be processed to produce germanium-free buried layers. Dashed line 37 is pictorial representation of the limits of the P-buried layer up diffusion in the absence of the retarding influence of germanium.

FIG. 7 is a graph that plots the active carrier concentrations versus depth relative to the original wafer surface. Curve 38 shows the concentration of carriers in the presence of germanium, while curve 39 shows the concentration without the germanium. The background of about $4 \times 10^{14}$/cc represents the N-type wafer doping. The resultant PN junction is at a depth of slightly less than 0.2 microns when germanium is present and at about twice this depth where the germanium is absent. The resultant buried layer 36 of FIG. 6 will have a peak doping density of about $2 \times 10^{18}$ carriers/cc which represents a silicon resistivity substantially less than 0.01 ohm centimeter.

The invention has been described and a preferred embodiment detailed. Alternative embodiments have also been described. When a person skilled in the art reads the foregoing description, alternatives and equivalents, within the spirit and intent of the invention, will be apparent. Accordingly, it is intended that the scope of the invention be limited only by the claims that follow.

We claim:

1. A process for retarding the out-diffusion of a combination of boron and gallium forming a buried layer of P-type active impurities in a silicon structure comprising an N-type substrate having a P-type epitaxial layer grown thereon, wherein said buried layer is located at the substrate to epitaxial layer interface, said process comprising the step of:

incorporating germanium into said silicon in the region of said buried layer in an amount sufficient to retard the diffusion of said combination of boron and gallium.

2. The process of claim 1 wherein said germanium is incorporated by means of an ion implantation step.

3. The process of claim 2 wherein said ion implantation is followed by an annealing step.

4. The process of claim 2 wherein said boron and gallium as well as said germanium are incorporated by way of ion implantation.

5. The process of claim 4 wherein said active impurity implantation is followed by an annealing step.

6. A process for producing a buried layer in a silicon substrate comprising the steps:

forming a masking oxide on said substrate;
    forming an opening in said masking oxide where said buried layer is to be created;
    ion implanting germanium into said substrate by way of said opening in said masking oxide;
    annealing said ion implanted germanium;
    ion implanting is a combination of boron and gallium into said substrate by way of opening in said masking oxide;
    annealing said ion implanted gallium and boron;
    removing all oxide from said substrate surface; and
    providing an epitaxial silicon layer over said substrate surface whereby said germanium, gallium and boron atoms are located near the substrate to epitaxial layer interface and said germanium acts to retard the diffusion of said gallium and boron atoms into said silicon.

7. The process of claim 6 wherein said step of forming an opening in said masking oxide is followed immediately by an oxidation step and an oxide strip whereby said silicon inside said opening is removed thereby creating an indentation in said silicon substrate where said buried layer is to be formed.

* * * * *